United States Patent [19]
Muraoka

[11] Patent Number: 5,392,240
[45] Date of Patent: Feb. 21, 1995

[54] SEMICONDUCTOR MEMORY DEVICE

[75] Inventor: Kazuyoshi Muraoka, Yokohama, Japan

[73] Assignee: Kabushiki Kaisha Toshiba, Kawasaki, Japan

[21] Appl. No.: 83,189

[22] Filed: Jun. 29, 1993

[30] Foreign Application Priority Data

Jun. 29, 1992 [JP] Japan .................. 4-171227

[51] Int. Cl.6 ............................................ H01L 27/10
[52] U.S. Cl. .................... 365/189.01; 365/189.07; 365/189.09; 365/196; 365/202; 365/207; 365/227
[58] Field of Search ................. 365/202, 210, 189.09, 365/203, 189.07, 196, 189.01, 207, , 227

[56] References Cited

U.S. PATENT DOCUMENTS

| 4,370,737 | 1/1983 | Chan | 365/203 |
|---|---|---|---|
| 5,117,394 | 5/1992 | Amin et al. | 365/203 |
| 5,153,853 | 10/1992 | Eley et al. | 365/185 |
| 5,255,235 | 10/1993 | Miyatake | 365/202 |
| 5,258,959 | 11/1993 | Dallabora et al. | 365/203 |

Primary Examiner—Eugene R. LaRoche
Assistant Examiner—Viet Q. Nguyen
Attorney, Agent, or Firm—Foley & Lardner

[57] ABSTRACT

A semiconductor memory device comprises: a first bit line connected to a memory cell via a first switching element; a second bit line connected to a reference cell via a second switching element; a reference potential writing circuit for writing a reference potential in the reference cell; an equalizing circuit for equalizing the first and second bit lines in potential; a sense amplifier for detecting data in the memory cell on the basis of a difference in potential between the first and second bit lines; and a control section for reading data in the memory cell and data in the reference cell to the first bit line and the second bit line, respectively, and thereafter for activating the sense amplifier and roughly simultaneously turning off the second switching element. In the semiconductor memory device, the reference cell writing potential can be stabilized without fluctuations for higher operation reliability; the operating current can be reduced for lower current consumption; and the cycle time can be reduced for higher speed operation.

20 Claims, 7 Drawing Sheets

SEMICONDUCTOR MEMORY DEVICE

FILED OF THE INVENTION

The present invention relates to a semiconductor memory device, and more specifically to a semiconductor memory device provided with reference cells for storing reference potentials.

BACKGROUND OF THE INVENTION

FIG. 2 is a circuit diagram showing a core block of a conventional semiconductor memory device in which a DRAM (dynamic random access memory) is shown in particular as a typical example of MOS type semiconductor memory devices. In the DRAM shown in FIG. 2, the reading operation margin of each of memory cells is compensated for on the basis of each reference potential written in each reference cell. In more detail, in FIG. 2, a pair of bit lines B0 and B1 are connected to a bit line equalize circuit 31. The bit line equalize circuit 31 is connected to a sense amplifier circuit 32. A reference cell 23 is connected to the bit line B0 via a reference cell transfer gate 22. Further, the reference cell 23 is connected to a reference cell writing potential VREF via a reference potential writing gate 21. On the other hand, another memory cell 25 is connected to the bit line B0 via another memory cell transfer gate 24. Similarly, a reference cell 30 is connected to the bit line B1 via a reference cell transfer gate 28. Further, the reference cell 30 is connected to the reference cell writing potential VREF via a reference potential writing gate 29. On the other hand, another memory cell 27 is connected to the bit line B1 via another memory cell transfer gate 26.

A reference cell writing gate WG0 is connected to the reference potential writing gate 21. A reference cell select line RWL0 is connected to the reference cell transfer gate 22. A word line WL0 is connected to the memory cell transfer gate 24. On the other hand, a reference cell writing gate WG1 is connected to the reference potential writing gate 29. A reference cell select line RWL1 is connected to the reference cell transfer gate 28. A word line WL1 is connected to the memory cell transfer gate 26. Further, an equalize circuit activating signal EQL is given to the bit line equalize circuit 31. A sense amplifier activating signal SE is given to the sense amplifier circuit 32.

Conventional Example 1

The operation of the first conventional semiconductor memory device constructed as described above will be described hereinbelow in accordance with a timing chart shown in FIG. 3.

In an active cycle as shown in FIG. 3(A), a row address strobe inversion signal/RAS changes from an H level to an L level at time t0, so that a row address is acquired. On the basis of the row address, a core block as shown in FIG. 2 is selected. Once the core block is selected as described above, as shown in FIG. 3(B), the equalize circuit activating signal EQL given to the bit line equalize circuit 31 is deactivated at time t1. Further, as shown in FIG. 3(C), the reference cell writing gate WG1 is deactivated at time t2. Accordingly, the reference potential writing gate 29 (the conduction status between the reference cell 30 and the reference cell wiring potential VREF) is turned off. Then, as shown in FIG. 3(D), a word line driving signal WD is activated at time t3, so that the word line WL0 of the core block selected on the basis of the acquired row address is activated at time t4, as shown in FIG. 3(E). The word line WL0 is connected to the gate of the memory cell transfer gate 24, so that data of the memory cell 25 connected to this transfer gate 24 is read out to the bit line B0, as shown in FIG. 3(H). At roughly the same timing, the reference cell select line RWL1 is activated. In more detail, as shown in FIG. 3(F), the reference cell select line RWL1 inputted to the gate of the reference cell transfer gate 28 (which is connected to the bit line B1) is activated at time t4. Therefore, as shown in FIG. 3(H), data of the reference cell 30 is read out to the bit line B1. Successively, as shown in FIG. 3(G), the sense amplifier activating signal SE given to the sense amplifier circuit 32 is activated at time t5. Therefore, the sense amplifier circuit 32 amplifies and outputs a minute potential difference between the bit line B0 and the bit line B1.

In the precharge cycle, as shown in FIG. 3(A), the row address strobe inversion signal/RAS changes from the L level to the H level at time t7. Therefore, as shown in FIGS. 3(E) and (F), the word line WL0 is reset to near the ground level at time t9 and the reference cell select line RWL1 is reset to near the ground level at time t15, respectively. Thereafter, as shown in FIG. 3(G), the sense amplifier activating signal SE is deactivated at time t10 to stop the amplification operation thereof. Then, as shown in FIG. 3(B), the equalize circuit activating signal EQL is activated at time t11 to start the operation of the bit line equalize circuit 31, so that the bit lines B0 and B1 are equalized at a bit line precharge potential, as shown in FIG. 3(H). At time 12 (almost the same as time t11), the reference cell writing gate WG1 is activated, so that the reference cell writing potential VREF is written in the reference cell 30 via the reference potential writing gate 29.

Further, in the above-mentioned description, nothing is described of the functions of the reference cell 23, the reference cell transfer gate 22, the reference potential writing gate 21, the memory cell 27 and the memory cell transfer gate 26. However, the functions of these elements are the same as those of the reference cell 30, the reference cell transfer gate 28, the reference potential writing gate 29, the memory cell 25 and the memory cell transfer gate 24, except that the relationship between the bit line B0 and the bit line B1 is reversed.

In the above-mentioned method of driving the conventional semiconductor memory device, data opposite in level to the data stored in the memory cell 25 is restored in the reference cell 30. Accordingly, when the reference cell transfer gate 28 is closed on the basis of the reference cell select line RWL1 and further the reference potential writing gate 29 is opened on the basis of the reference cell writing gate WG1, the reference cell writing potential VREF and the data of the reference cell 30 are shorted to each other. Therefore, although the reference cell writing potential VREF is offset from a preset value temporarily, as shown in FIG. 3(I), this potential VREF returns to the set potential value after a time has elapsed. In this case, however, in case an active cycle starts in the time duration where the reference cell writing potential VREF is being offset from the preset value, there arises a problem in that an unbalanced condition not intended in designing the memory device occurs between the reading sensitivity of the memory cell 25 and the reading sensitivity of the memory cell 27.

Conventional Example 2

The operation of the other conventional semiconductor memory device constructed as shown in FIG. 2 will be described hereinbelow in accordance with a timing chart shown in FIG. 4.

In an active cycle as shown in FIG. 4(A), a row address strobe inversion signal/RAS changes from an H level to an L level at time t0, so that a row address is acquired. On the basis of the row address, a core block as shown in FIG. 2 is selected. Once the core block is selected, as shown in FIG. 4(B), the equalize circuit activating signal EQL given to the bit line equalize circuit 31 is deactivated at time t1. Further, as shown in FIG. 4(C), the reference cell writing gate WG1 is deactivated at time t2. Accordingly, the reference potential writing gate 29 (conduction status between the reference cell 30 and the reference cell wiring potential VREF) is turned off. Then, as shown in FIG. 4(D), a word line driving signal WD is activated at time t3, so that the word line WL0 of the core block selected on the basis of the acquired row address is activated at time t4, as shown in FIG. 4(E). The word line WL0 is connected to the gate of the memory cell transfer gate 24, so that data of the memory cell 25 connected to this transfer gate 24 is read out to the bit line B0, as shown in FIG. 4(H). At roughly the same timing, the reference cell select line RWL1 is activated. In more detail, as shown in FIG. 4(F), the reference cell select line RWL1 inputted to the gate of the reference cell transfer gate 28 (which is connected to the bit line B1) is activated at time t4. Therefore, as shown in FIG. 4(H), data of the reference cell 30 is read out to the bit line B1. Successively, as shown in FIG. 4(G), the sense amplifier activating signal SE given to the sense amplifier circuit 32 is activated at time t5. Therefore, the sense amplifier circuit 32 amplifies and outputs a minute potential difference between the bit line B0 and the bit line B1. The above-mentioned operation is the same as with the case of the first conventional example explained with reference to FIG. 3.

In the precharge cycle, as shown in FIG. 4(A), the row address strobe inversion signal/RAS changes from the L level to the H level at time t7. Therefore, as shown in FIG. 4(E), the word line WL0 is reset to near the ground level at time t9. Thereafter, as shown in FIG. 4(G), the sense amplifier activating signal SE is deactivated at time t10 to stop the amplification operation thereof. Then, as shown in FIG. 4(B), the equalize circuit activating signal EQL is activated at time t11 to start the operation of the bit line equalize circuit 31, so that the bit lines B0 and B1 are equalized to each other at a bit line precharge potential, as shown in FIG. 4(H). At this time, the equalized potential of both the bit lines B0 and B1 is written in the reference cell 30. At time t14 almost the same as the abovementioned timing, the reference cell writing gate WG1 is activated, so that the reference cell writing potential VREF is written in the reference cell 30 via the reference potential writing gate 29.

Further, in the above-mentioned description, nothing is described of the functions of the reference cell 23, the reference cell transfer gate 22, the reference potential writing gate 21, the memory cell 27 and the memory cell transfer gate 26. However, the functions of these elements are the same as those of the reference cell 30, the reference cell transfer gate 28, the reference potential writing gate 29, the memory cell 25 and the memory cell transfer gate 24, except that the relationship between the bit line B0 and the bit line B1 is reversed.

In the above-mentioned method of driving the conventional semiconductor memory device, in the precharge cycle, the equalized potential of both the bit lines B0 and B1 is written in the reference cell 30. Thereafter, the reference cell select line RWL1 is reset to near the ground level. Therefore, it is necessary to wait the timing at which the reference cell writing gate WG1 is activated, for a time duration in which the two bit lines B0 and B1 are equalized to each other in potential, thus raising a problem in that the precharge time is increased and therefore long. Here, where the equalize time required for both the bit lines B0 and B1 is not waited, in case the reference cell 30 (in which data opposite in level to that stored in the memory cell 25 is restored) is shorted to the reference cell writing potential VREF, since the reference cell writing potential VREF is largely offset from the preset value temporarily, the same problem as with the case of the driving method described with reference to FIG. 3 arises.

As described above, in the conventional semiconductor memory device, there exists a problem in that the reference cell writing potential VREF is offset from the preset value temporarily and thereby unbalanced condition arises in data reading sensitivity between the memory cell 25 and the memory cell 27 or a precharge cycle time increases. Further, since the current flowing when the reference cells are charged or discharged cannot be disregarded and therefore is not negligible, there exists another problem in that the operating current is relatively large, as compared with the case where no reference cells are provided.

SUMMARY OF THE INVENTION

With these problems in mind, therefore, the object of the present invention is to provide a semiconductor memory device provided with reference cells each capable of writing a reference potential, which can secure a reference cell writing potential little in fluctuation to improve the operation reliability, reduce the operating current, and realize a high speed cycle time.

To achieve the above-mentioned object, the present invention provides a semiconductor memory device, comprising: a first bit line connected to a memory cell via first switching means; a second bit line connected to a reference cell via second switching means; reference potential writing means for writing a reference potential in the reference cell; equalizing means for equalizing said first and second bit lines in potential; a sense amplifier for detecting data in the memory cell on the basis of a difference in potential between said first and second bit lines; and control means for reading data in the memory cell and data in the reference cell to said first bit line and said second bit line, respectively, and thereafter for activating said sense amplifier and roughly simultaneously turning off said second switching means.

When the first switching means is turned on, data in the memory cell is read to the first bit line; and when the second switching means is turned on, data in the reference cell is read to the second bit line. Thereafter, the second switching means is turned off, roughly simultaneously when the sense amplifier is activated. Therefore, the reference cell is disconnected from the second bit line, so that it is possible to prevent fluctuations in potential of the reference cell.

DETAILED DESCRIPTION OF THE PREFERRED EMBODIMENTS

Embodiments of the semiconductor memory device according to the present invention will be described hereinbelow with reference to the attached drawings.

Embodiment 1

Figure 1:
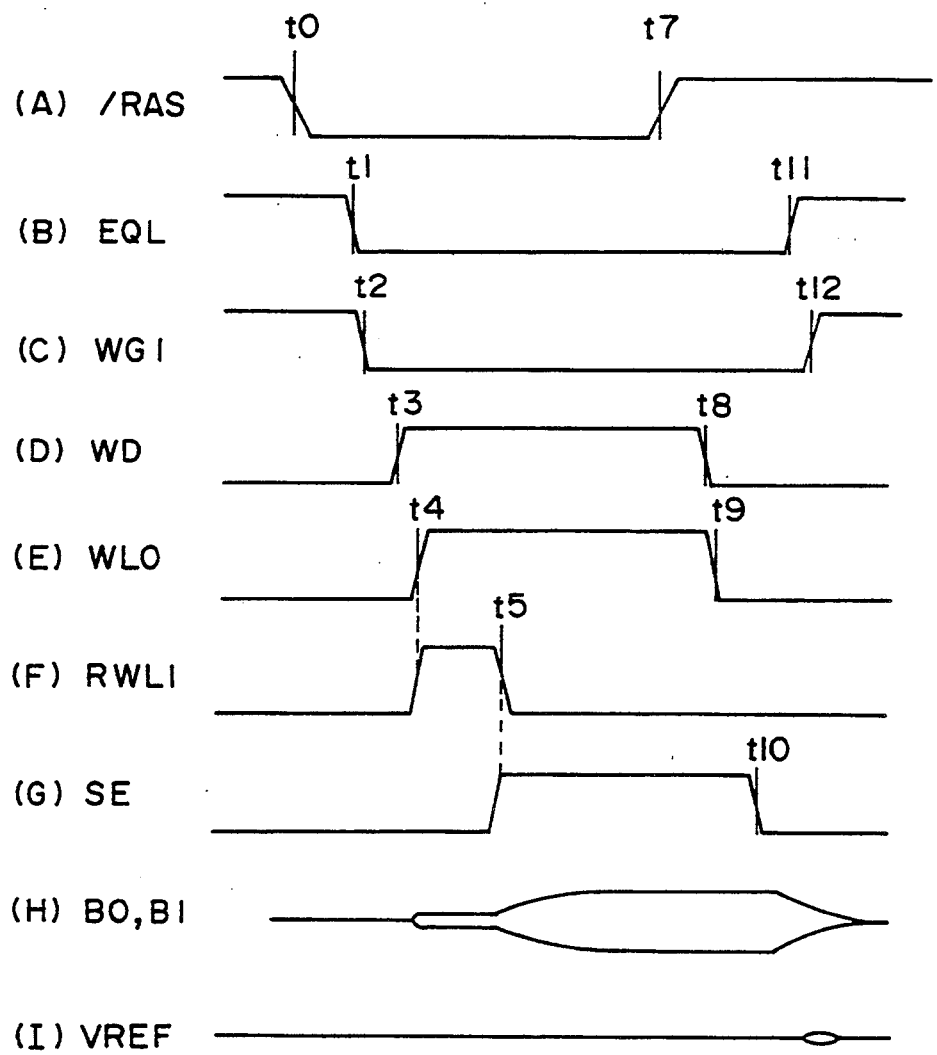
FIG. 1 is a timing chart for assistance in explaining the operation of one embodiment of the semiconductor memory device according to the present invention.
Figure 2:
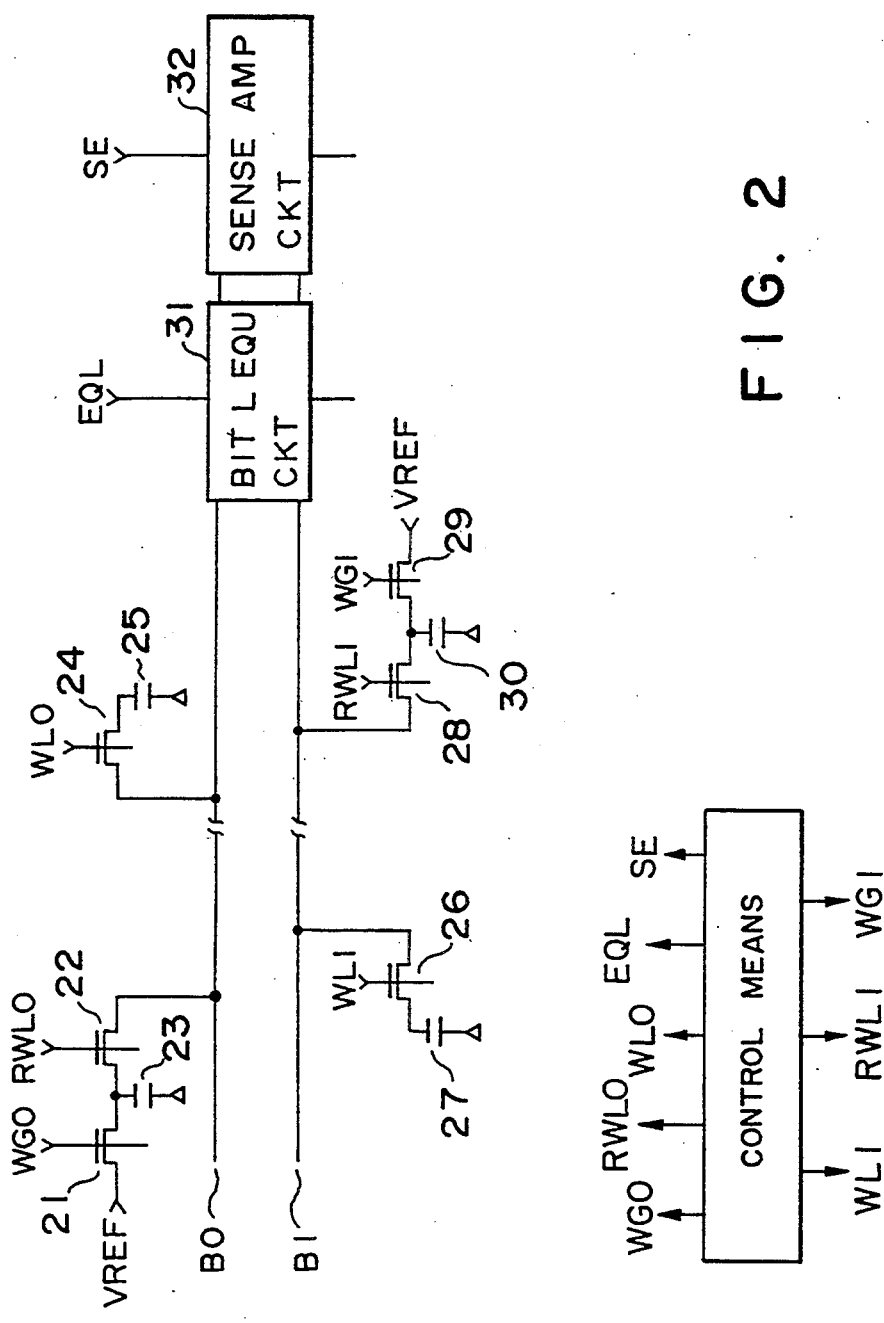
FIG. 2 is a circuit diagram showing a core block of an ordinary semiconductor memory device.

FIG. 1 is a timing chart for assistance in explaining the operation of one embodiment of the present invention when applied to the core block shown in FIG. 2.

Figure 3:
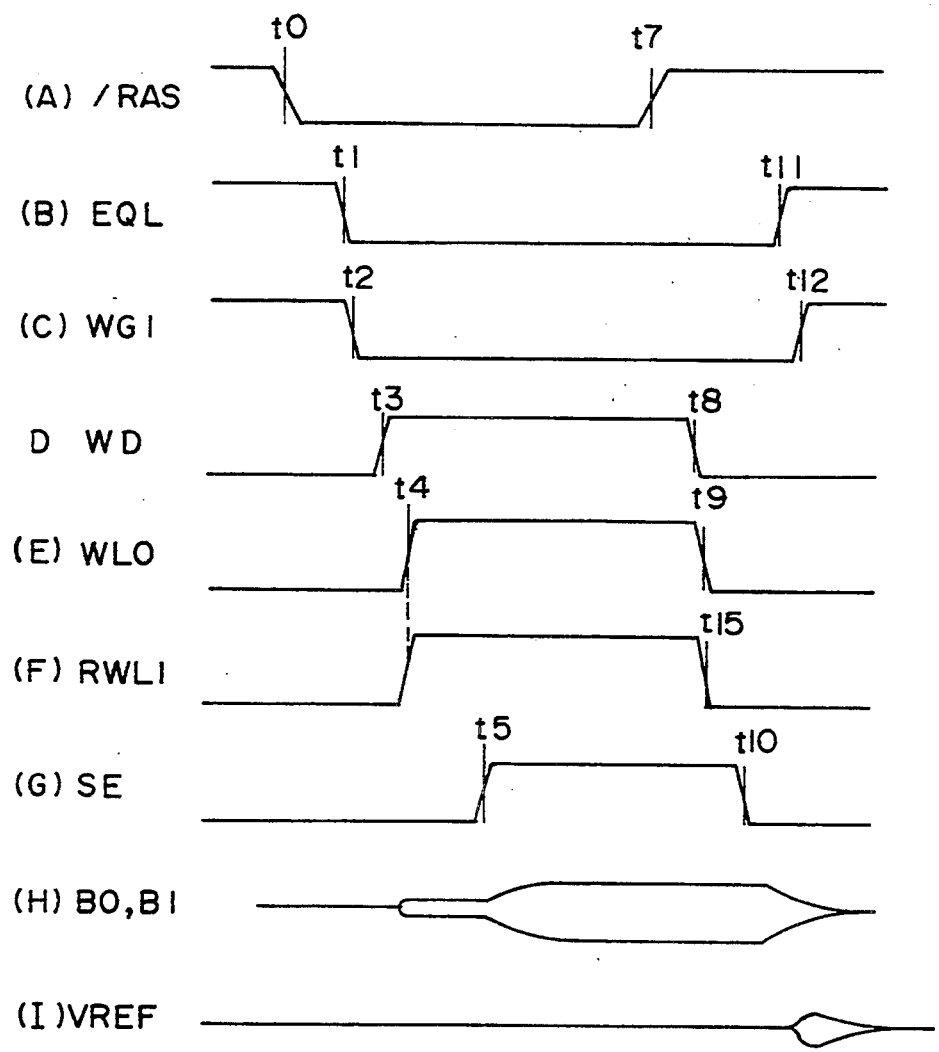
FIG. 3 is a timing chart for assistance in explaining the operation of a conventional example.
Figure 4:
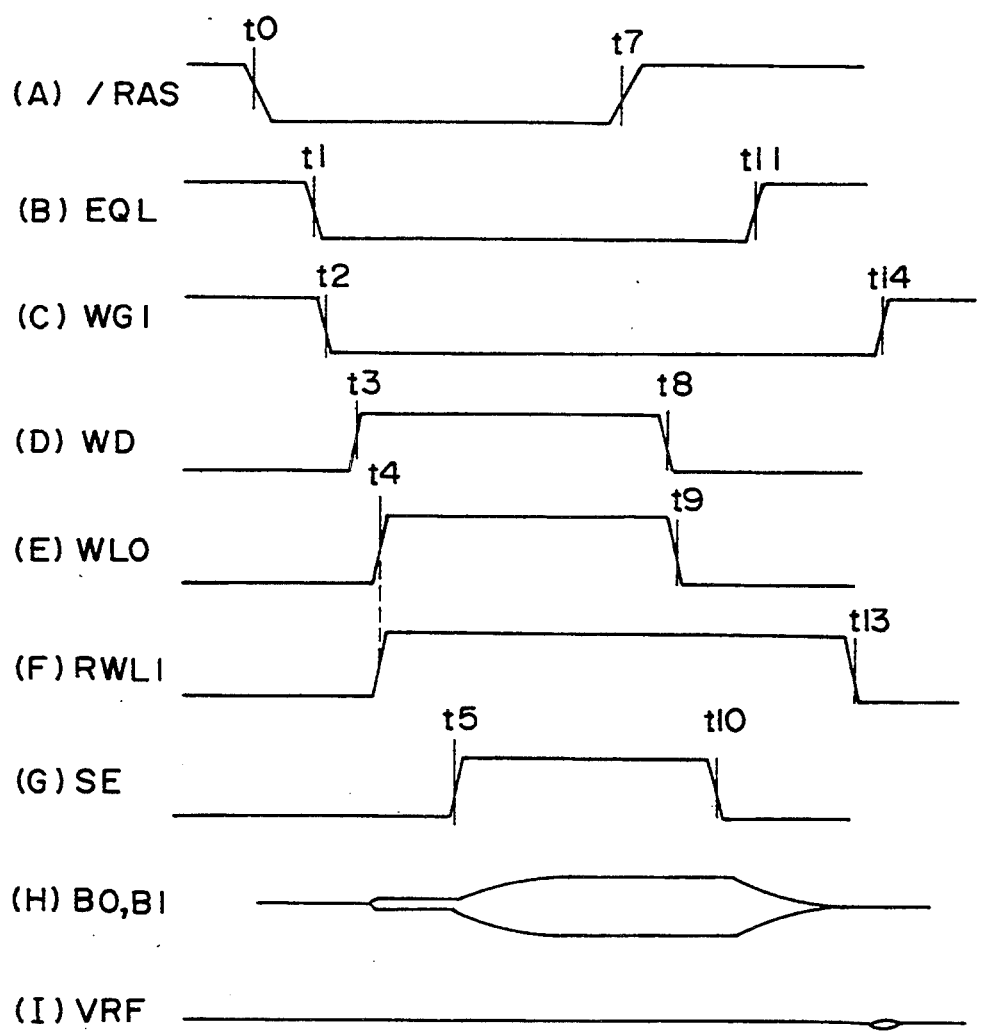
FIG. 4 is a timing chart for assistance in explaining the operation of another conventional example.

In an active cycle as shown in FIG. 1(A), a row address strobe inversion signal/RAS changes from an H level to an L level at time t0, so that a row address is acquired. On the basis of the row address, a core block as shown in FIG. 2 is selected. Once the core block is selected as described above, as shown in FIG. 1(B), the equalize circuit activating signal EQL given to the bit line equalize circuit 31 is deactivated at time t1. Further, as shown in FIG. 3(C), the reference cell writing gate WG1 is deactivated at time t2, so that the reference potential writing gate 29 (the conduction status between the reference cell 30 and the reference cell wiring potential VREF) is turned off. Then, as shown in FIG. 1(D), a word line driving signal WD is activated at time t3, so that the word line WL0 and the reference cell select line RWL1 of the core block selected on the basis of the acquired row address are activated at time t4, respectively, as shown in FIGS. 1(E) and (F). Therefore, as shown in FIG. 1(H), data of the memory cell 25 is read out to the bit line B0 via the memory transfer gate 24 having a gate to which the word line WL0 is inputted. Similarly, as shown in FIG. 1(H), data of the memory cell 30 is read out to the bit line B1 via the memory transfer gate 28 having a gate to which the word line WL1 is inputted. Successively, as shown in FIG. 1(G), the sense amplifier activating signal SE given to the sense amplifier circuit 32 is activated at time t5. Therefore, the sense amplifier circuit 32 amplifies and outputs a minute potential difference between the bit line B0 and the bit line B1. Further, as shown in FIG. 1(F), before or after time t5 at which the sense amplifier circuit 32 starts to operate, the reference cell select line RWL1 is deactivated, so that the reference cell 30 and the bit line B1 are disconnected from each other electrically.

In the precharge cycle, as shown in FIG. 1(A), the row address strobe inversion signal/RAS changes from the L level to the H level at time t7. Therefore, as shown in FIGS. 1(D) and (E), the word line WD is deactivated at time t8 and the word line WL0 is deactivated at time t9, respectively. Thereafter, as shown in FIG. 1(G), the sense amplifier activating signal SE is deactivated at time t10 to stop the amplification operation thereof. Then, as shown in FIG. 1(B), the equalize circuit activating signal EQL is activated at time t11 to start the operation of the bit line equalize circuit 31, so that the bit lines B0 and B1 are equalized to each other. At time 12 (almost the same as time t11), as shown in FIG. 1(C), the reference cell writing gate WG1 is activated, so that the reference cell writing potential VREF is written in the reference cell 30 via the reference potential writing gate 29.

Where the reference cell 30 is activated at the timing as described above, the reference cell select line RWL1 is deactivated under the condition that the potential of the bit line B1 is low (in a minute amplitude) before amplified by the sense amplifier circuit 32. In other words, the potential of the reference cell 30 is set to a value near the precharge potential of the bit line (before the bit line B1 is equalized). Accordingly, even when the reference cell 30 and the reference cell writing potential VREF are shorted to each other in the precharge cycle, it is possible to reduce the fluctuations of the reference cell writing potential VREF. Consequently, the unbalance will not occur in the data read sensitivity between the H level and the L level of the memory cell data in the succeeding active cycle. Further, since the reference cell writing gate WG1 is deactivated under the condition that the potential of the bit line B1 is low (in a minute amplitude) before amplified by the sense amplifier circuit 32, it is possible to suppress the charge and discharge current of the reference cell 30 and therefore to reduce the operating current. In addition, it is unnecessary to write the equalized potential of the bit lines B0 and B1 to the reference cell 30, so that the precharge time is not short, thus realizing a short cycle time and a high speed operation.

Figure 5:
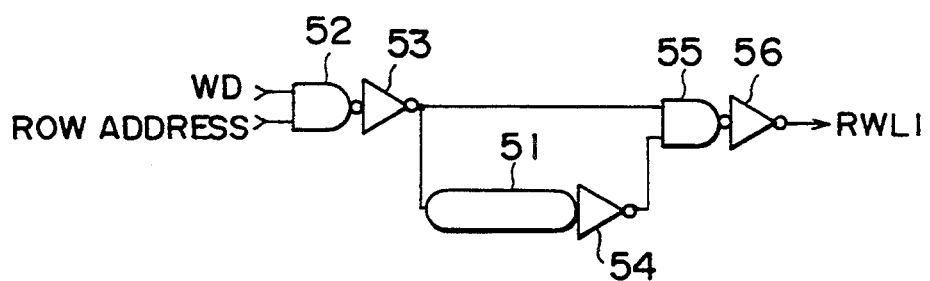
FIG. 5 is a circuit diagram showing a circuit for deriving a reference cell select line to realize the driving method shown in FIG. 1.

FIG. 5 is a circuit diagram showing a circuit for deriving a reference cell select line RWL to realize the driving method shown in FIG. 1. As shown in FIG. 5, the word line driving signal WD and a row address are inputted to a NAND circuit 52. The output of the NAND circuit 52 is inverted by an invertor circuit 53, and then given to another NAND circuit 55 and a delay circuit 51. The output of the delay circuit 51 is inverted by another inverter circuit 54. Further, the outputs of the two inverter circuits 53 and 54 are inputted to the NAND circuit 55. The output of the NAND circuit 55 is inverted by an inverter circuit 56, and the inverted signal is outputted to the reference cell select line RWL1.

In the circuit configuration as described above, the reference cell select line RWL1 is activated on the basis of the word line driving signal WD and the row address, and further deactivated after a time determined by the delay circuit 51 has elapsed. The timing at which the reference cell select line RWL1 is deactivated is set to near the timing at which the sense amplifier circuit 32 is activated. The above-mentioned setting can be effected by setting the delay time of the delay circuit 51.

Figure 6:
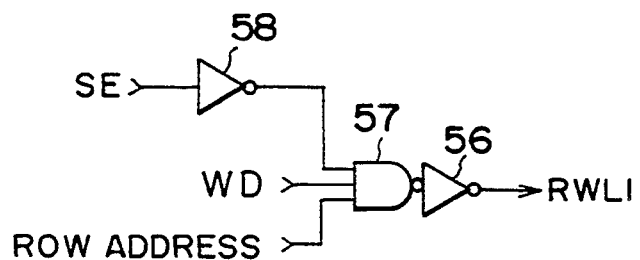
FIG. 6 is another circuit diagram showing a circuit for deriving a reference cell select line to realize the driving method shown in FIG. 1.

FIG. 6 shows another circuit for deriving a reference cell select line RWL1 to realize the driving method shown in FIG. 1. As shown in FIG. 6, the sense amplifier activating signal SE is inverted by an inverter circuit 58. The inverted signal /SE is inputted to a NAND circuit 57 together with the word line driving signal WD and a row address. The output of the NAND circuit 57 is inverted by another inverter circuit 56 to derive the reference cell select line RWL1.

In the circuit configuration as described above, since the reference cell select line RWL1 is activated on the basis of the word line select line WD, and further deactivated on the basis of the sense amplifier activating signal SE, it is possible to attain the operation as explained with reference to the timing chart as shown in FIG. 1.

Embodiment 2

Figure 7:
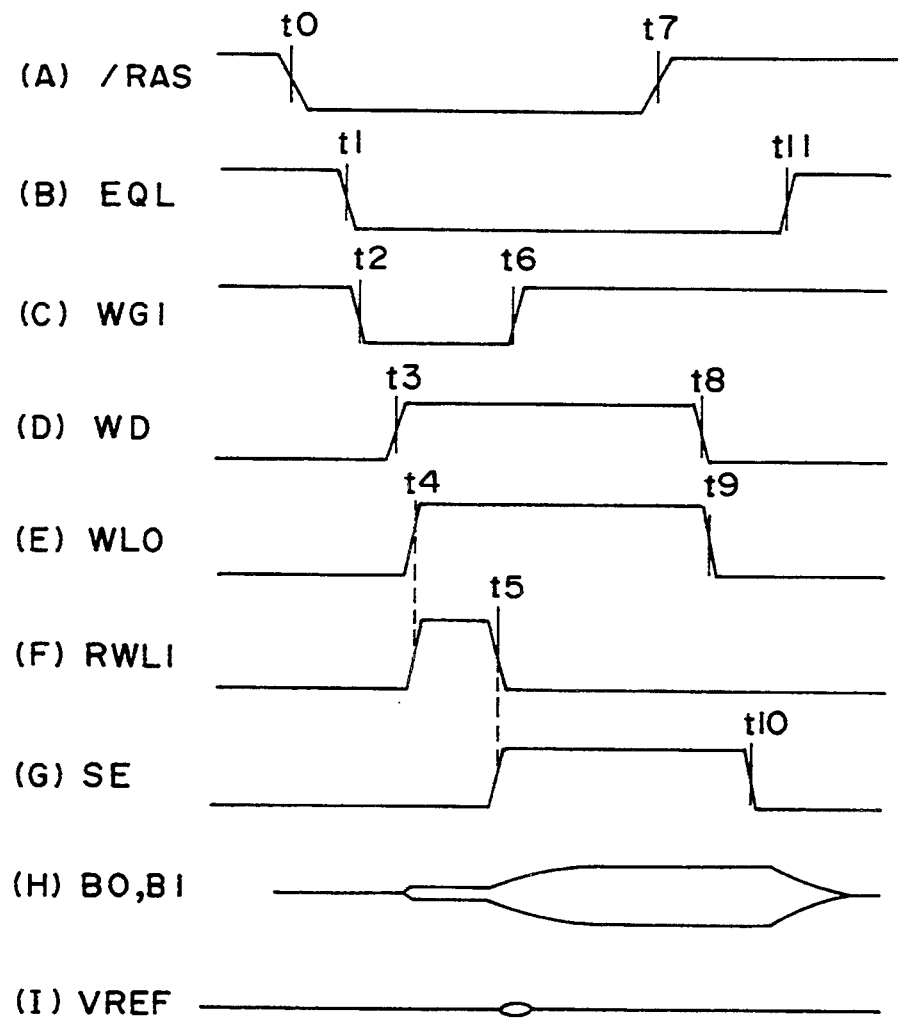
FIG. 7 is a timing chart for assistance in explaining the operation of the other embodiment of the semiconductor memory device according to the present invention.

FIG. 7 is a timing chart for assistance in explaining the operation of another embodiment of the present invention when applied to the core block shown in FIG. 2.

In an active cycle as shown in FIG. 7(A), a row address strobe inversion signal /RAS changes from an H level to an L level at time t0, so that a row address is acquired. On the basis of the row address, a core block as shown in FIG. 2 is selected. Once the core block is selected as described above, as shown in FIG. 7(B), the equalize circuit activating signal EQL given to the bit line equalize circuit 31 is deactivated at time t1. Further, as shown in FIG. 7(C), the reference cell writing gate WG1 is deactivated at time t2. Accordingly, the reference potential writing gate 29 (the conduction status between the reference cell 30 and the reference cell wiring potential VREF) is turned off. Then, as shown in FIG. 7(D), a word line driving signal WD is activated at time t3, so that the word line WL0 and the reference cell select line RWL1 of the core block selected on the basis of the acquired row address are activated at time t4, respectively, as shown in FIGS. 7(E) and (F). Therefore, as shown in FIG. 7(H), data of the memory cell 25 is read out to the bit line B0 via the memory transfer gate 24 having a gate to which the word line WL0 is inputted. Similarly, as shown in FIG. 7(H), data of the memory cell 30 is read out to the bit line B1 via the memory transfer gate 28 having a gate to which the word line WL1 is inputted. Successively, as shown in FIG. 7(G), the sense amplifier activating signal SE given to the sense amplifier circuit 32 is activated at time t5. Therefore, the sense amplifier circuit 32 amplifies and outputs a minute potential difference between the bit line B0 and the bit line B1. Further, as shown in FIG. 7(F), before or after time t5 at which the sense amplifier circuit 32 starts to operate, the reference cell select line RWL1 is deactivated, so that the reference cell 30 and the bit line BL1 are disconnected from each other electrically. Thereafter, as shown in FIG. 7(C), the reference cell writing gate WG1 is activated at time t6, so that the reference cell writing potential VREF is written in the reference cell 30.

In the precharge cycle, as shown in FIG. 7(A), the row address strobe inversion signal/RAS changes from the L level to the H level at time t7. Therefore, as shown in FIGS. 7(D) and (E), the word line WD is deactivated at time t8 and the word line WL0 is deactivated at time t9, respectively. Thereafter, as shown in FIG. 7(G), the sense amplifier activating signal SE is deactivated at time t10 to stop the amplification operation thereof. Then, as shown in FIG. 7(B), the equalize circuit activating signal EQL is activated at time t11 to start the operation of the bit line equalize circuit 31, so that the bit lines B0 and B1 are equalized to each other.

In summary, the points different from the first embodiment are that the reference cell writing gate WG1 is activated at time t6 during the active cycle as shown in FIG. 7(C) and further the reference cell writing potential VREF is written in the reference cell 30.

In the second embodiment, since the reference cell writing gate WG1 is controlled in accordance with the timing as described above, the following effect can be obtained in addition to the effect of the first embodiment: even if the cycle time is short, it is possible to execute the succeeding active cycle under the condition that the reference cell writing potential VREF is set to the setting value more closely, so that it is possible to further decrease the cycle time and increase the operation speed.

Figure 8:
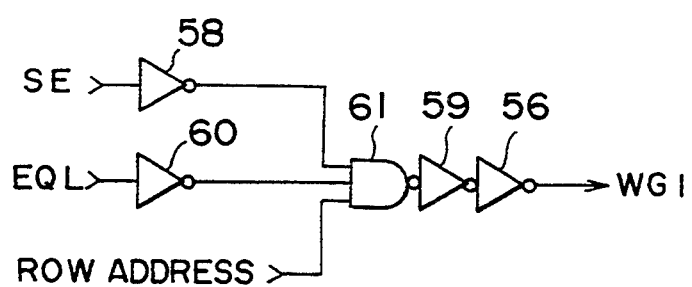
FIG. 8 is a circuit diagram showing a circuit for deriving a reference cell writing gate to realize the driving method shown in FIG. 7.

FIG. 8 is a circuit diagram showing a circuit for deriving a reference cell writing gate WG1 to realize the driving method shown in FIG. 7. As shown in FIG. 7, the sense amplifier activating signal SE is inputted to an NAND circuit 61 via an inverter circuit 58; the equalize circuit activating signal EQL is inputted to the NAND circuit 61 via an inverter circuit 60; and a row address is directly inputted to the NAND circuit 61. The output of the NAND circuit 61 is outputted via two inverter circuits 59 and 56 connected in series, as the reference cell writing gate WG1.

The circuit configured as described above operates as follows: the row address strobe inversion signal/RAS is delayed so as to become in phase with the equalize circuit activating signal EQL. When this equalize signal EQL changes from the H level to the L level, the reference cell writing gate WG1 is deactivated. Therefore, the reference cell writing potential VREF is electrically isolated from the reference cell 30. Successively, when the sense amplifier activating signal SE is activated and therefore changes from the L level to the H level, the reference cell writing potential VREF is also activated. Accordingly, the reference cell writing potential VREF is written in the reference cell 30.

Further, the circuits shown in FIGS. 5 and 6 can be adopted to derive the reference cell select line RWL1 necessary to realize the method explained with reference to the timing chart shown in FIG. 7. Further, with respect to the method of deriving the reference cell select line RWL1 and the reference cell writing gate WG1, it is possible to use various circuits other than the logic circuits shown in FIGS. 5, 6 and 8.

As described above, in the semiconductor memory device according to the present invention, the reference cell select line (RWL1) is deactivated under the condition that the bit line potential is not yet amplified and therefore low (in minute amplitude), and additionally the potential of the reference cell at this time is set to near the bit line precharge potential without waiting the bit line equalization. Accordingly, even if the reference cell is shorted to the reference cell writing potential in the precharge cycle, the fluctuation in the reference cell writing potential is little and thereby the unbalance in the sensitivity of reading the memory cell data will not occur in the succeeding active cycle, thus realizing a higher operation reliability. Further, since the reference cell writing gate is deactivated under the condition that the bit line potential is not yet amplified and therefore low (in minute amplitude), it is possible to suppress the charge and discharge current to and from the reference cells, thus reducing the operating current. Furthermore, since it is unnecessary to write the equalized bit potential in the reference cell, the precharge cycle time can be reduced, thus decreasing the cycle time and thereby increasing the operating speed.

As described above, in the semiconductor memory device according to the present invention, the reference cell writing potential can be stabilized, and the operating potential can be lowered; and the cycle time can be reduced for high speed operation.

What is claimed is:

1. A semiconductor memory device, comprising:
   a first bit line connected to a memory cell via first switching means;
   a second bit line connected to a reference cell via second switching means;
   reference potential writing means for writing a reference potential in said reference cell;
   equalizing means for equalizing said first and second bit lines in potential;
   a sense amplifier for detecting data in said memory cell on the basis of a difference in potential between said first and second bit lines; and
   control means for reading data in said memory cell and data in the reference cell to said first bit line and said second bit line, respectively, and thereafter for activating said sense amplifier and substantially simultaneously turning off said second switching means.

2. The semiconductor memory device of claim 1, wherein said control means controls turning-on or -off operation of said first and second switching means, operation of said reference potential writing means, operation of said equalizing means, and operation of said sense amplifier, respectively.

3. The semiconductor memory device of claim 2, wherein said control means deactivates said equalizing means and said reference potential writing means, before reading data in the memory cell and data in the reference cell to said first bit line and said second bit line, respectively.

4. The semiconductor memory device of claim 3, wherein said control means disconnects the memory cell from said first bit line and thereafter activates said equalizing means, after having disconnected the reference cell from said second bit line and substantially simultaneously activated said sense amplifier.

5. The semiconductor memory device of claim 4, wherein said control means activates said reference potential writing means, after having activated said equalizing means.

6. The semiconductor memory device of claim 4, wherein said control means deactivates said sense amplifier, between when the memory cell is disconnected from said first bit line and when said equalizing means is activated.

7. The semiconductor memory device of claim 5, wherein said control means deactivates said sense amplifier, between when the memory cell is disconnected from said first bit line and when said equalizing means is activated.

8. The semiconductor memory device of claim 3, wherein said control means activates said reference potential writing means, after having activated said sense amplifier and substantially simultaneously turned off said second switching means.

9. The semiconductor memory device of claim 8, wherein said control means disconnects the memory cell from said first bit line and thereafter activates said equalizing means, after having activated said reference potential writing means.

10. The semiconductor memory device of claim 9, wherein said control means deactivates said sense amplifier, between when the memory cell is disconnected from said first bit line and when said equalizing means is activated.

11. The semiconductor memory device of claim 7, wherein said control means further output a turning on/off signal to said second switching means, to turn off said second switching means a constant time after having turned on said second switching means.

12. The semiconductor memory device of claim 10, wherein said control means further comprises a drive circuit for outputting a turning on/off signal to said second switching means, to turn of said second switching means a constant time after having turned on said second switching means.

13. The semiconductor memory device of claim 11, wherein said drive circuit is activated on the basis of a logical result of a word line drive signal and a row address signal.

14. The semiconductor memory device of claim 12, wherein said drive circuit is activated on the basis of a logical result of a word line drive signal and a row address signal.

15. The semiconductor memory device of claim 11, wherein said drive circuit is activated on the basis of a logical result of a word line drive signal, a row address signal and a sense amplifier activating signal.

16. The semiconductor memory device of claim 12, wherein said drive circuit is activated on the basis of a logical result of a word line drive signal, a row address signal and a sense amplifier activating signal.

17. The semiconductor memory device of claim 10, wherein said control means further comprises a signal output circuit for outputting a turning on/off signal to said reference potential writing means, to turn on said reference potential writing means a constant time after having turned off said reference potential writing means.

18. The semiconductor memory device of claim 17, wherein said signal output circuit is activated on the basis of a logical result of a sense amplifier activating signal, an equalizing means activating signal and a row address signal.

19. The semiconductor memory device of claim 7, wherein a second memory cell is connected to said first bit line via third switching means; a second reference cell is connected to said second bit line via fourth switching means; and second reference potential writing means for writing a reference potential is connected to the second reference cell.

20. The semiconductor memory device of claim 10, wherein a second memory cell is connected to said first bit line via third switching means; a second reference cell is connected to said second bit line via fourth switching means; and second reference potential writing means for writing a reference potential is connected to the second reference cell.

* * * * *